(12) United States Patent
Kawoosa et al.

(10) Patent No.: US 11,747,399 B2
(45) Date of Patent: *Sep. 5, 2023

(54) SCAN TEST CONTROL DECODER WITH STORAGE ELEMENTS FOR USE WITHIN INTEGRATED CIRCUIT (IC) DEVICES HAVING LIMITED TEST INTERFACE

(71) Applicant: TEXAS INSTRUMENTS INCORPORATED, Dallas, TX (US)

(72) Inventors: Mudasir Shafat Kawoosa, Srinagar (IN); Vishal Diwan, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,583

(22) Filed: Jun. 29, 2022

(65) Prior Publication Data

US 2022/0326302 A1    Oct. 13, 2022

Related U.S. Application Data

(63) Continuation of application No. 17/080,424, filed on Oct. 26, 2020, now Pat. No. 11,402,432, which is a continuation of application No. 16/460,405, filed on Jul. 2, 2019, now Pat. No. 10,852,353.

(51) Int. Cl.
| | |
|---|---|
| *G01R 31/3177* | (2006.01) |
| *G01R 31/317* | (2006.01) |
| *G01R 31/3183* | (2006.01) |
| *G01R 31/3185* | (2006.01) |

(52) U.S. Cl.
CPC ... *G01R 31/3177* (2013.01); *G01R 31/31713* (2013.01); *G01R 31/31723* (2013.01); *G01R 31/31727* (2013.01); *G01R 31/318385* (2013.01); *G01R 31/318547* (2013.01); *G01R 31/318555* (2013.01)

(58) Field of Classification Search
CPC .......... G01R 31/3177; G01R 31/31723; G01R 31/31713; G01R 31/31727; G01R 31/318385; G01R 31/318547; G01R 31/318555
USPC ................................ 714/726, 727, 729, 724
See application file for complete search history.

(56) References Cited

U.S. PATENT DOCUMENTS

| | | | | |
|---|---|---|---|---|
| 5,648,733 A | * | 7/1997 | Worrell | H04L 12/403 326/86 |
| 10,060,979 B2 | * | 8/2018 | Kawoosa | G01R 31/3177 |
| 10,852,353 B1 | * | 12/2020 | Kawoosa | G01R 31/31727 |
| 11,402,432 B2 | * | 8/2022 | Kawoosa | G01R 31/3177 |
| 2009/0111413 A1 | * | 4/2009 | Luschi | H04B 1/0003 455/230 |

(Continued)

Primary Examiner — John J Tabone, Jr.
(74) Attorney, Agent, or Firm — Michael T. Gabrik; Frank D. Cimino (57) ABSTRACT

An integrated circuit (IC) includes logic components and a scan test circuit coupled to the logic components. The IC also includes a scan input pin coupled to the scan test circuit. The IC also includes a scan input/output pin coupled to the scan test circuit. The scan test circuit includes a decoder coupled to at least one of the scan input pin and the scan input/output pin. The decoder includes storage elements configured to store different scan control signals and to output at least one of the different scan control signals in response to a master control signal.

13 Claims, 6 Drawing Sheets

(56) References Cited

U.S. PATENT DOCUMENTS

| | | | |
|---|---|---|---|
| 2009/0228231 A1* | 9/2009 | Hakoo | G01R 31/318572 |
| | | | 702/120 |
| 2010/0332929 A1* | 12/2010 | Branch | G01R 31/318552 |
| | | | 714/E11.155 |
| 2011/0099442 A1* | 4/2011 | Hales | G01R 31/318533 |
| | | | 714/E11.155 |
| 2011/0185244 A1* | 7/2011 | Mikami | G01R 31/31858 |
| | | | 714/E11.02 |
| 2013/0024737 A1* | 1/2013 | Marinissen | G01R 31/318511 |
| | | | 714/E11.155 |
| 2013/0305106 A1* | 11/2013 | Mittal | G01R 31/318536 |
| | | | 714/E11.155 |
| 2018/0321311 A1* | 11/2018 | Kawoosa | G01R 31/31727 |
| 2021/0041497 A1* | 2/2021 | Kawoosa | G01R 31/318385 |
| 2022/0326302 A1* | 10/2022 | Kawoosa | G01R 31/318385 |

\* cited by examiner

FIG. 6

SCAN TEST CONTROL DECODER WITH STORAGE ELEMENTS FOR USE WITHIN INTEGRATED CIRCUIT (IC) DEVICES HAVING LIMITED TEST INTERFACE

CROSS REFERENCE TO RELATED APPLICATION(S)

This application is a continuation of and claims priority to U.S. patent application Ser. No. 17/080,424, filed Oct. 26, 2020, which is a continuation of U.S. patent application Ser. No. 16/460,405, filed Jul. 2, 2019 (now U.S. Pat. No. 10,852,353), which applications are incorporated by reference in their entireties.

BACKGROUND

Some integrated circuits (ICs) include testing hardware to enable verification that no input or output of a logic gate within a target test circuit gets stuck (or is maintained) at a fixed value (e.g., logic 0 or logic 1) or does not transit within a specific time period during operation due to unforeseen circumstances, such as, for example, a short circuit. The test used with the testing hardware is referred to as a scan test. In one example, scan tests are performed on a combinatorial portion and a sequential portion of an IC. The sequential portion of the IC may include a sequence of one or more storage elements (e.g. flip-flops). During a scan test, the storage elements corresponding to the sequential portion of the IC are coupled as a scan chain, and a test vector is transferred into the scan chain through one or more input test pins provided on the IC. The IC is then placed in an evaluation or mission mode (e.g., a capture phase) so as to cause one or more inputs and states of one or more storage elements to be evaluated, and a corresponding response vector obtained in the evaluation mode is shifted out through one or more output test pins. The bit values in the response vector are compared with an expected output to determine fault conditions in the IC.

As the design complexity increases, the requirement for number of pins to be used for scan test purpose increases. Such requirements can be met in a high pin count IC design. However, for a very low-pin count IC design, the number of device pins available for scan test purposes is fewer. With fewer pins available, the test time for scan testing operations is increased. Increased test time negatively affects the commercialization efficiency of ICs as test stations are expensive and thus limited.

SUMMARY

In accordance with one example of the disclosure, an integrated circuit (IC) comprises logic components and a scan test circuit coupled to the logic components. The IC also comprises a scan input pin coupled to the scan test circuit. The IC also comprises a scan input/output pin coupled to the scan test circuit. The scan test circuit comprises a decoder coupled to at least one of the scan input pin and the scan input/output pin. The decoder comprises storage elements configured to store different scan control signals and to output at least one of the different scan control signals in response to a master control signal.

In accordance with one example of the disclosure, an electronic circuit comprises logic components and a scan path coupled to the logic components. The electronic circuit also comprises scan data pins and scan control pins coupled to the scan path. The electronic circuit also comprises a decoder coupled to the scan data pins and the scan control pins. The decoder comprises storage elements configured to store different scan control signals and to output at least one of the different scan control signals in response to a master control signal. The electronic circuit also comprises tester interface nodes coupled to the decoder.

In accordance with one example of the disclosure, a method for performing an integrated circuit scan test comprises a selectively storing, by a decoder, different scan control signals. The method also comprises receiving, by the decoder, a master control signal. The method also comprises outputting, by the decoder, at least one of the different scan control signals in response to receiving the master control signal. The method also comprises using the at least output scan control signal to perform scan test operations.

BRIEF DESCRIPTION OF THE DRAWINGS

For a detailed description of various examples, reference will now be made to the accompanying drawings in which.

DETAILED DESCRIPTION

Disclosed herein are integrated circuit (IC) topologies with a scan test circuit for ICs with limited scan pins available. In some examples, the scan test circuit includes a scan test decoder that uses storage elements to provide different scan control signals. Examples of scan control signals include but not limited to are: a scan enable signal, a channel mask load enable, a multiple input shift register (MISR) reset control signal, a MISR read control signal, or an override functional reset control signal (scan reset). In some examples, the storage elements include a combination of flip-flops and latches configured to shift in scan control signals. In these examples, the scan test decoder is coupled to at least one scan input pin or scan input/output pin (shared or dedicated) to generate the scan control signals. Once the scan control signals are latched using flip-flops and respective latches, a master control signal is used to pass the loaded scan control signals to different control components of the scan test circuit. In other examples, the storage elements include a latch for each scan control signal, where each latch is coupled to a different scan input pin or scan input/output pin. In other examples, a combination of multiple scan input/output pins is used to generate multiple variants of scan control signals.

In an example scenario, where higher multi-site (MS) testing is targeted, even the high pin count design shrinks its pin availability. For example, in MS of X128, a max of 8 pins are available for test per device. Out of the maximum 8 pins available, some of the pins (e.g., test clock, a PLL reference clock, a Power-On-Reset) are assigned to Automated Test Equipment (ATE). If JTAG is present, then an additional Test Mode Select (TMS) pin needs to be accommodated within the allocated 8 pins available, leaving a maximum of 4 pins for test operations. In this example scenario, every single pin has a significant impact on device test configuration and the overall test time.

In some scan test scenarios, there are few scan control signals that are pseudo static (i.e., the scan control signals do not toggle on a per cycle basis but only during a specific period within a test). In one test scenario, a Scan Enable control signal remains high throughout the scan shift process and toggles only during scan capture phase. Another example is a Scan Reset control signal that remains high throughout the scan test except during a few occasions when reset coverage is targeted. In a more scan related example, a Channel Mask Load Enable (CMLE) signal related to specific scan architecture also has utilization only when the mask flop chains are getting loaded. For the rest of the time the CMLE signal remains low. Also, in advanced scan architectures having sequential decompressor and compactor like MISR compression or Linear Feedback Shift Register (LFSR) compression or Compact MISR, pins like MRE (MISR reset), MISR OBS (MISR Observe) and LFSR Reset pins are also considered as pseudo-static. With some of the proposed IC topologies, one test pin is used to serially load all scan control signals and to register them internally before starting the test.

In some examples, the latch control is a top-level pin which need not to be a dedicated but can selectively be shared with other ATE contacted signals. In one non-limiting example, if on-chip IEEE 1149.x JTAG is available, then the TMS pin can be used as a latch control pin. These latches are also clocked with the same scan clock as used for a scan test. When the control pin is asserted, all required scan control signals are serially loaded into a set of registers through a single test pin, which can be any of the available scan input pins or shared scan input/output pints. When the control pin is de-asserted, the scan control signals are latched. With such a scalable mechanism in place, any number of scan control signals can be generated internally and any time the value on a different scan control pin is needed, an update can seamlessly be done. During loading of scan control signals into the latches, the clock to the rest of the IC circuit is blocked so as not to disturb the state of the IC components to be tested and thus avoid any data corruption. To provide a better understanding, various scan test circuit options, including scan test decoder options, are described using the figures as follows.

Figure 1:
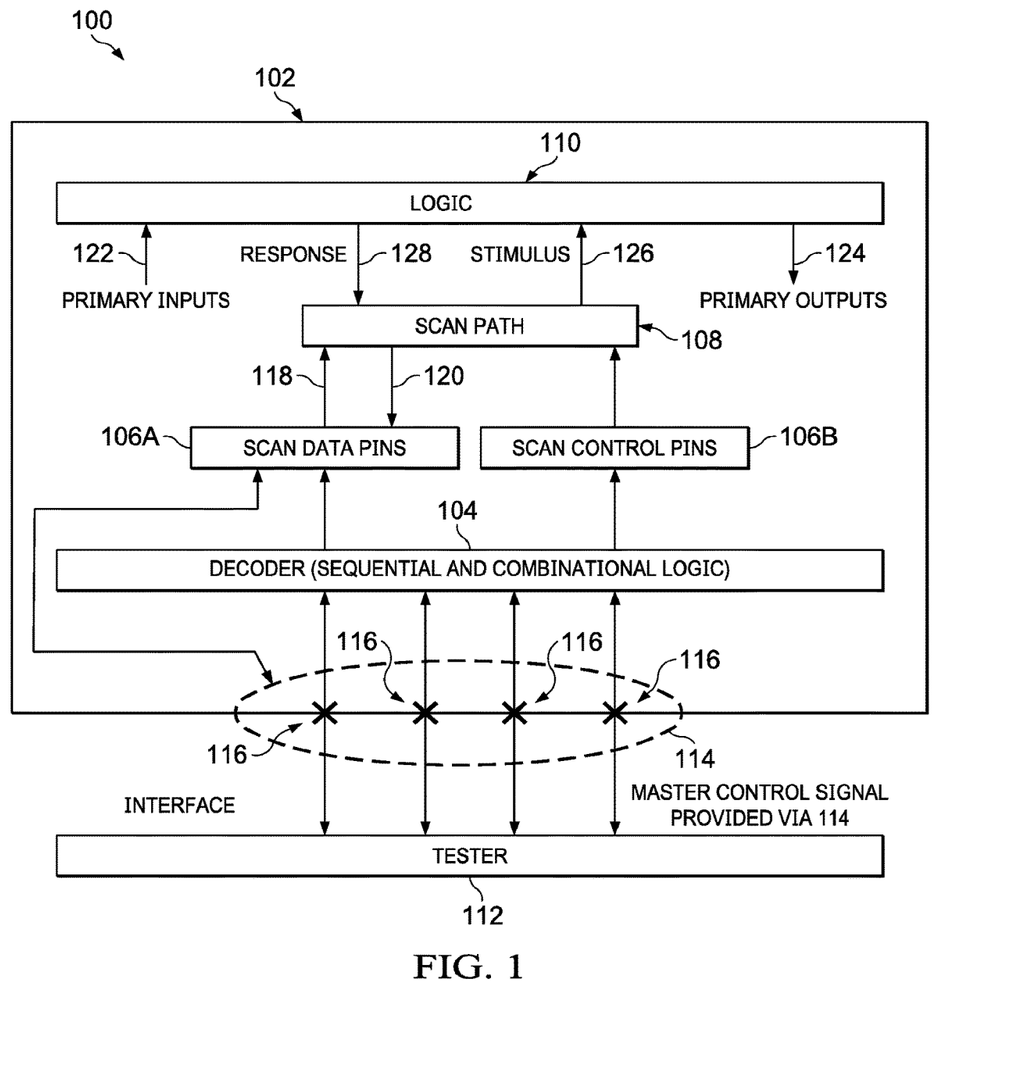
FIG. 1 is a block diagram showing a scan test system in accordance with some examples.

FIG. 1 is a block diagram showing a scan test system 100 in accordance with some examples. As shown, the scan test system 100 of FIG. 1 includes a tester 112 and an IC 102 to be tested. In different examples, scan architectures can be applied at various circuit levels. For example, the components of the IC 102 may represent the testing of a complete IC, or may represent the testing of a sub-circuit within the IC 102 (e.g., a digital signal processor (DSP) or central processing unit (CPU) sub-circuit). As shown, the IC 102 includes an interface 114 with pins 116 (tester interface nodes). In different examples, the pins 116 correspond to scan input pins, scan output pins, or shared scan input/output pins. While four pins 116 are represented in FIG. 1, the number of pins 116 may vary in different examples. In the example of FIG. 1, the decoder 104, the scan data pins 106A, the scan control pins 106B, and the scan path 108 correspond to a scan test circuit coupled between the pins 116 and the logic 110, where the scan test circuit enables the tester 112 to test the logic 110 and to receive test results.

In FIG. 1, a decoder 104 (sometimes referred to as a scan test decoder herein) is coupled to the interface. In some examples, the decoder 104 uses storage elements to store different scan control signals (e.g., a scan enable control, a channel masking control, a multiple input shift register (MISR) reset control, a MISR read control, or an override functional reset control (scan reset)). In some examples, the storage elements include a combination of flip-flops and latches configured to shift in a scan enable control signal. In these examples, the decoder 104 is coupled to at least one scan input pin or shared scan input/output pin (e.g., one of the pins 116) to program the scan control signal. Once the scan control signals are loaded using flip-flops and respective latches, a master control signal (e.g., received via the interface 114) is used to pass the latched scan control signals to different components of the scan test circuit (e.g., the scan control pins 106B of FIG. 1). In other examples, the storage elements of the decoder 104 include a latch for each scan control signal, where each latch is coupled to a different scan input pin or shared scan input/output pin (e.g., one of the pins 116) to program (store) the scan control signals to be used. Upon receipt of the master control signal, the scan control signals stored by the decoder 104 are output to different components of the scan test circuit to perform related scan test operations.

In the example of FIG. 1, the decoder 104 is coupled to scan data pins 106A and scan control pins 106B. The scan data pins 106A and scan control pins 106B correspond to internal IC pins or nodes coupled to a scan path 108. In operation, the decoder 104 is configured to pass scan data from the interface 114 to the scan path 108 or to pass scan data from the scan path 108 to the interface 114.

During scan test, various operations involving the tester 112 and the IC 102 are performed, including: (1) providing scan control signals to the scan path 108; (2) outputting serial test stimulus patterns to the scan path 108 via scan input path 118; (3) inputting serial test response patterns from scan path 108 via scan output path 120; (4) outputting parallel test stimulus patterns to the logic 110 via a primary input path 122; and (5) inputting parallel test response patterns from the logic 110 via a primary output path 124. In some examples, the scan path 108 operates to provide output parallel test stimulus patterns to the logic 110 via a stimulus path 126, and to receive input parallel response patterns from the logic 110 via a response path 128.

In some examples, the tester 112 is interfaced to the IC 102 by probing the IC die pads at wafer level, or by contacting package pins represented by the interface 114. Also, in some examples, the primary input path 122 and the primary output path 124 are achieved by augmentation of the scan path 108. For example, the scan path 108 could be lengthened to include boundary scan cells located on each primary input and primary output of the logic 110. In such case, the boundary scan cells would provide primary inputs to and primary outputs from the logic 110, via widened stimulus and response busses 126 and 128, respectively. In some instances, the logic 110 may be sufficiently tested by scan path 108 such that it is not necessary to provide primary inputs to and outputs from the logic 110 via the tester or via the above described augmentation of scan path 108. For example, if the amount of the logic 110 made testable by the use of the scan path 108 in combination with the primary inputs and outputs is very small compared to the amount of the logic 110 made testable by the scan path 108 alone, then the primary input and output connections to logic 110 may be removed without significantly effecting test operations for the logic 110. To simplify the description of the present disclosure, it will be assumed that the logic 110 is sufficiently tested using only the scan path 108 (the primary input path 122 and the primary output path 124 are not used in the description). As desired, the primary input and output paths 122 and 124 and/or an augmented scan path 108 may be used in some examples.

Figure 2:
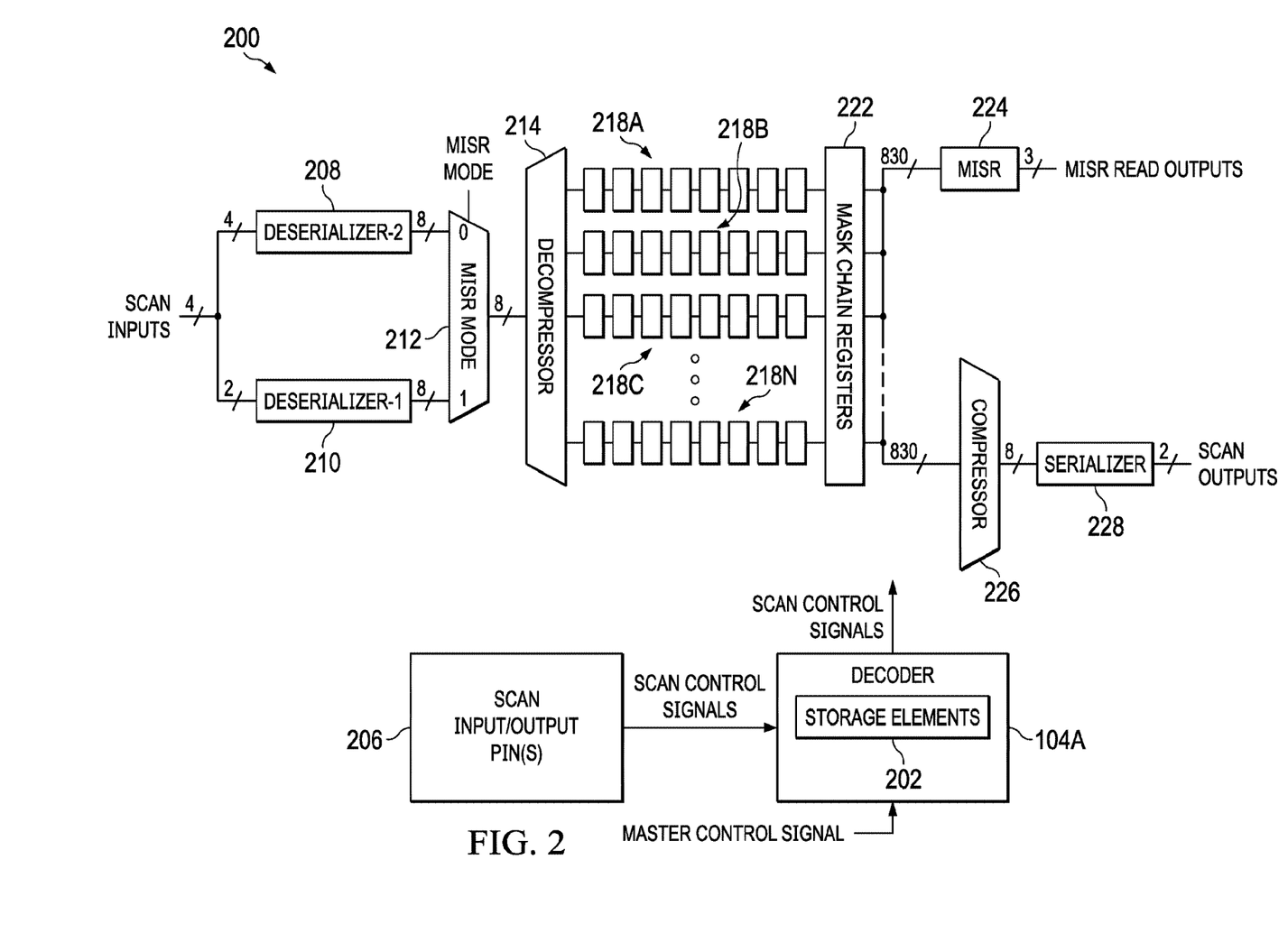
FIG. 2 is a block diagram showing a scan test scenario in accordance with some examples.

FIG. 2 is a block diagram showing a scan test scenario 200 in accordance with some examples. In the scan test scenario 200, various components are represented to show different scan test modes. In some examples, the scan test scenario 200 is compliant with IEEE 1149.1. As shown, the scan test scenario 200 includes decompressor logic 214 and compressor logic 226. The decompressor logic 214 receives a stream of data and control signals from an external test system, such as the tester 112 in FIG. 1, and separates the stream into scan chain paths 218A-218N (e.g., corresponding to the scan path 108 of FIG. 1) based on the supported test protocol. In a similar manner, the compressor 226 receives data from the scan chain paths 218A-218N and combines them into a data stream that is provided to an external test system, such as the tester 112.

Various known or later developed techniques may be used for a test pattern compression/decompression. For example, various type of encoding may be used, such as: statistical codes, run-length codes, or Golomb codes. Other implementations may be based on XOR networks, multiplexers, or reuse of scan chains, for example. Other implementations may be based on test pattern compaction and/or overlapping, for example. The test patterns may be compressed by an external tester or on-chip using LFSR and then decompressed by the decompressor 214 using one technique, while the result data may be compressed by the compressor 226 using the same or a different compression technique.

In some examples, each of the scan chain paths 218A-218N may contain several dozen, several hundred, or even several thousand scan cells. Also, a long scan chain may be divided into several smaller chains that are then each coupled to the decompressor 214 and the compressor 224 or 226 and operate in parallel. In this example, only a few scan cells are illustrated in each of the scan chain paths 218A-218N, but it should be understood that each of the scan chain paths 218A-218N may include several tens or hundreds of scan cells.

In some examples, for low pin count test, configurable deserializers 208 and 210 are selectively used to divide each stream of test pattern data into multiple separate streams of data in order to form larger streams of test pattern data that are provided to the decompressor 214. The decompressor 214 then parcels the test pattern data to the various scan chain paths 218A-218N where it is then shifted through each of the scan chain paths 218A-218N when the decoder 104A provides a scan enable control signal (e.g., SCAN_EN) while a scan clock operates for a period of time.

Once an entire pattern of test data is scanned into the scan chain paths 218A-218N, SCAN_EN may be de-asserted and one or more scan clock cycles are performed to cause response data from logic (e.g., the logic 110 in FIG. 1) to be loaded into the scan chain paths 218A-218N. For each test, a sufficient number of clock cycles are used to input all stimuli and to obtain all response from logic (e.g., the logic 110) being tested. During each test interval, the number of clock cycles may be just one for performing stuck-at testing, or two or more for performing sequential at-speed testing or as decided by the ATPG tool.

After a response from logic being tested (e.g., the logic 110) has been captured in the scan chain paths 218A-218N, the response data may then be scanned out by again asserting SCAN_EN and operating a scan clock for a period of time. In some examples, the compressor 226 is used to compress the response data from multiple scan chain paths 218A-218N down to just few streams of response data. Also, in some examples, input/output buffers are used during the scan out process.

In the example of FIG. 2, mask chain registers 222 are included to allow certain bits that may not be deterministic during a test to be masked off. This then allows a multiple input signature register (MISR) 224 to accumulate a signature that may then be observed to reliably indicate that a test has passed or failed. In some examples, another scan control signal referred to as a pseudo static control signal "channel mask load enable" (CMLE) is only activated when mask flip flop chains are loaded. The CMLE signal is provided by the decoder 104A.

In some examples, the MISR 224 uses a compression architecture in which the on-chip MISR signature computation block generates a data signature based on sequences of multiple bit data values provided post masking by the mask chain registers 222. In this example, there may be as many as 830 data bits controlled by the mask chain registers 222 at the end of each computation cycle, assuming there are 830 internal scan chains in the chain paths 218A-218N 218A to 218N. In different examples, the resultant signature is read only at the end of a scan test or is read intermittently a few times during a test. This helps in avoiding usage of scan output pins during most of a test sequence and in return these scan output pins may instead be used as scan input pins to increase the scan data bandwidth. At the end of each test, scan input pins may be converted into scan output pins in order to read the signature.

With the architecture of the scan test scenario 200 of FIG. 2, additional control signals may be used, including a MISR reset signal (MRE) and a MISR observe signal (MISRO). The former is used to reset the MISR and the latter is used to enable observation of the signature. The MRE and MISRO signals are additional examples of pseudo-static scan control signals provided by the decoder 104A. Other embodiments may include additional or different scan control signals provided by the decoder 104A.

In the scan test scenario 200 of FIG. 2, the decoder 104A includes storage elements 202, where the decoder 104A is configured to provide different scan control signals (e.g., SCAN_EN, CMLE, MRE, MISRO, etc.) based on values loaded from at least one scan input/output pin 206 (e.g., scan input pins and/or shared scan input/output pins). In some examples, the scan control signals are loaded to the storage elements 202. When the master control signal is received by the decoder 104A, the programmed scan control signals are then released to respective control components of the scan test scenario 200.

Figure 3:
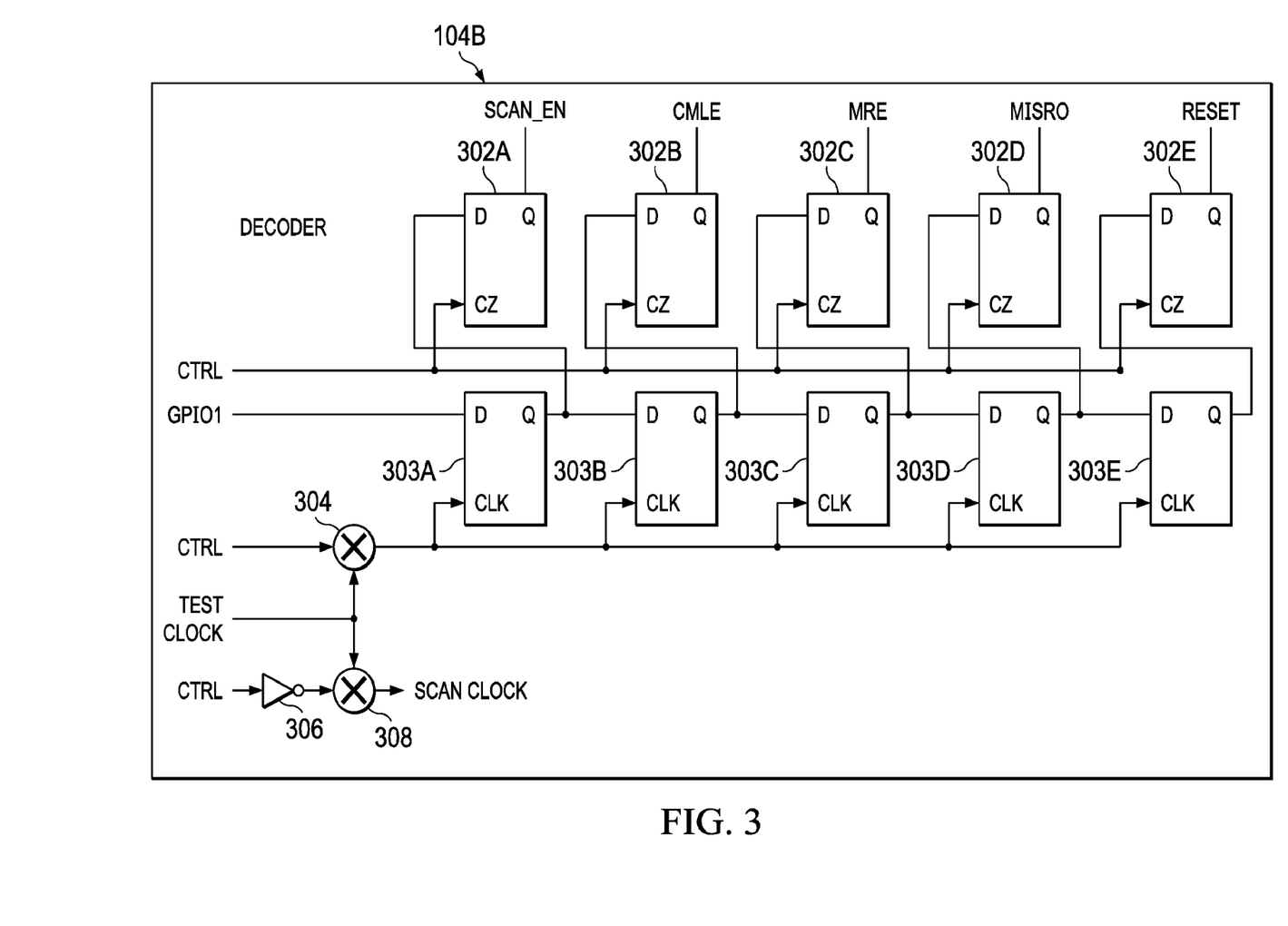
FIG. 3 is a schematic diagram showing a scan test decoder circuit in accordance with some examples.

FIG. 3 is a schematic diagram showing a scan test control decoder circuit 104B (an example of the decoder 104 in FIG. 1, or the device 104A in FIG. 2) in accordance with some examples. As shown, the decoder 104B comprises a plurality of latches 302A-302E coupled to a plurality of flip-flops 303A-303E. More specifically, in some examples, the D node input of latch 302A is coupled to the Q node output of the flip-flop 303A, the D node input of latch 302B is coupled to the Q node output of the flip-flop 303B, the D node input of latch 302C is coupled to the Q node output of the flip-flop 303C, the D node input of latch 302D is coupled to the Q node output of the flip-flop 303D, and the D node input of latch 302E is coupled to the Q node output of the flip-flop 303E.

As shown for illustration purposes, the Q node output of the latch 302A is a SCAN_EN signal, the Q node output of the latch 302B is a CMLE signal, the Q node output of the latch 302C is a MRE signal, the Q node output of the latch 302D is a MISRO signal, and the Q node output of the latch 302E is a ATPG RESET signal. To output any of these signals, respective scan control signals are loaded to the latches 302A-302E by first shifting into the flip-flops 303A-303E via an input pin (GPIO1). In the example of FIG. 3, GPIO1 corresponds to a scan input pin or a shared input/output pin as described herein. Also, the flip-flops 303A-303E are clocked by a test clock signal (TESTCLOCK) received via a clock gating logic 304, where TESTCLOCK is controlled by a master control signal (CTRL). Thus, when CTRL is high, the flip-flops 303A-303E are able to shift in the desired scan control signals. When CTRL is low, no shifting occurs because the output of the clock gating logic 304 is zero. As shown, TESTCLOCK is also provided to another clock gating logic 308, where the other input to the clock gating logic 308 is the inverse of CTRL (due to the inverter 306). Thus, in the example of FIG. 3, when CTLR is high, there is no scan clock (i.e., when scan control signals are being loaded, the scan clock is disabled). On the other hand, when CTLR is low, the scan clock is provided to scan chain paths (e.g., the scan chain paths 218A-218N of FIG. 2) to perform scan test operations (e.g., based in part on scan control signals provided by the decoder 104B and scan data).

In some examples, CTRL is provided either by an internal controller for an IC or related scan decoder. In the former case, CTRL is not received via an IC interface (e.g., the IC interface 114 of FIG. 1). Also, TESTCLOCK is provided by an available clock of the IC, GPIO1 is provided by a scan input pin or a shared scan input/output pin, and SCAN CLOCK is provided to the sequential logic inside the IC. When used, SCAN_EN (SE) is provided to scan flip-flops and some sequential elements like clock gates, CMLE is provided to masking control components, MRE is provided to MISR flops as a reset, and MISRO is provided to MISR logic to read the signature. In some examples, MISRO is also provided to, through some combinational logic, direct control of input/output pins. In one example, an input/output pin is shared as a scan input as well as MISR read output. In this example, ATPG RST may be used to override a functional reset during ATPG. The override operations are performed, for example, through a multiplexer that has functional reset as one input and ATPG RST as another, where the select line for the multiplexer can be a data register (e.g., an ATPG_MODE register).

Figure 4A:
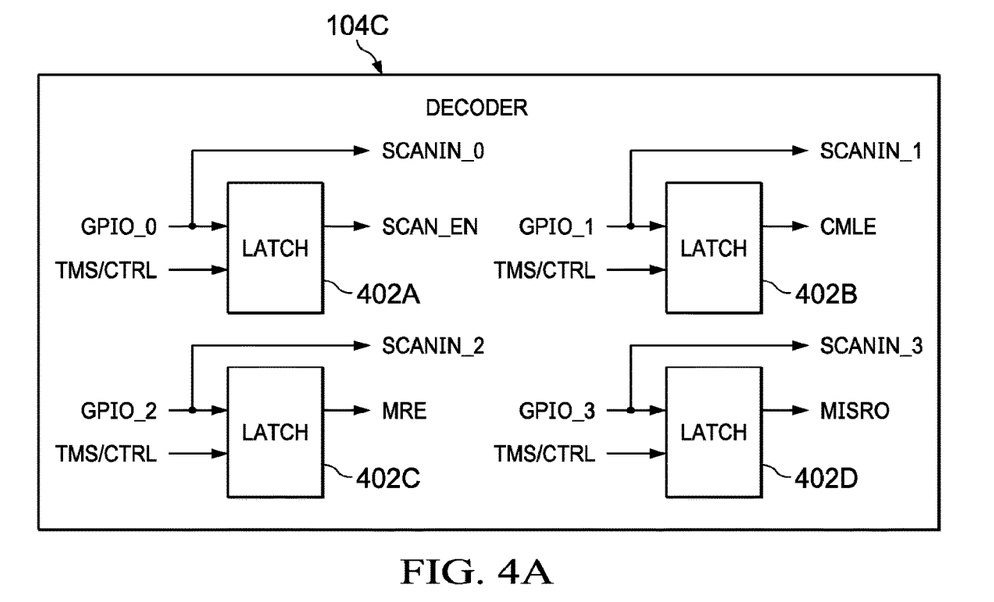
FIG. 4A is a schematic diagram showing another scan test decoder circuit in accordance with some examples.

FIG. 4A is a schematic diagram showing another scan test control decoder circuit 104C (an example of the decoder 104 in FIG. 1, or the device 104A in FIG. 2) in accordance with some examples. As shown, the decoder 104C comprises a plurality of latches 402A-402D. More specifically, in some examples, the latch 402A is coupled to a first input node (GPIO_0), the latch 402B is coupled to a second input node (GPIO_1), the latch 402C is coupled to a third input node (GPIO_2), and the latch 402D is coupled to a fourth input node (GPIO_3). Also, GPIO_0 is coupled to scan pin SCANIN_0, GPIO_1 is coupled to scan pin SCANIN_1, GPIO_2 is coupled to scan pin SCANIN_2, and GPIO_3 is coupled to scan pin SCANIN_3. Also, each of the latches 402A-402D are configured to receive a control signal (TMS or CTRL). In response to the TMS or CTRL signal being high, the latches 402A-402D are configured to latch respective scan control signals. More specifically, in some examples, the latch 402A is configured to provide a SCAN_EN signal, the latch 402B is configured to provide a CMLE signal, the latch 402C is configured to provide an MRE signal, and the latch 402D is configured to provide a MISRO signal. With the arrangement of FIG. 4A, scan control signals and scan data are provided by the available input pins (GPIO_0 to GPIO_3), which correspond to scan input pins and/or shared scan input/output pins (e.g., pins 116 of the interface 114) as described herein.

In some examples, CTRL is provided by an internal controller for an IC or related scan test decoder. In these examples, CTRL is received via an IC interface (e.g., the interface 114 of FIG. 1). In one example, even though TMS is usually static low during a scan test, TMS may be used as CTRL. Also, in the example of FIG. 4A, GPIO_0, GPIO_1, GPIO_2, and GPIO_3 are coupled to respective scan input pins or shared scan input/output pins. Also, SCANIN_0, SCANIN_1, SCANIN_2, and SCANIN_3 are coupled to a CoDec (e.g., the decompressor 214 of FIG. 2) as a pseudo scan input/output.

Figure 4B:
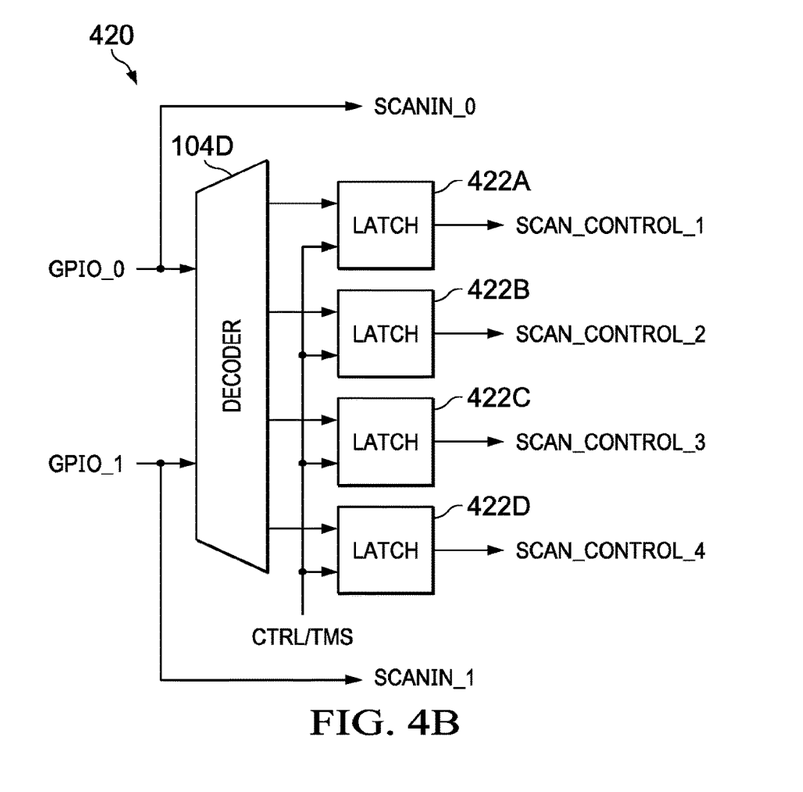
FIG. 4B is a schematic diagram showing another scan test decoder circuit in accordance with some examples.

FIG. 4B is a schematic diagram showing another scan test decoder circuit 104D in accordance with some examples. In the example of FIG. 4B, the scan test decoder circuit 104D has inputs coupled to a first input node (GPIO_0) and a second input node (GPIO_1). As shown, GPIO_0 is coupled to a first scan pin (SCANIN_0) and GPIO_1 is coupled to a second scan pin (SCANIN_1). Also, a plurality of latches 422A-422D are coupled to the scan test decoder circuit 104D.

In the example of FIG. 4B, the latches 422A-422D are selectively coupled to GPIO_0 or GPIO_1 through a combinational decoder (e.g., 2:4 decoder logic). Also, each of the latches 422A-422D are configured to receive a control signal (TMS or CTRL). In response to the TMS or CTRL signal being high, the latches 422A-422D are configured to latch respective scan control signals. In the example of FIG. 4B, the latch 422A is configured to provide a first scan control signal (Scan_Control_1), the latch 422B is configured to provide a second scan control signal (Scan_Control_2), the latch 422C is configured to provide a third scan control signal (Scan_Control_3), and the latch 422D is configured to provide a fourth scan control signal (Scan_Control_4). In different examples, each of Scan_Control_1, Scan_Control_2, Scan_Control_3, and Scan_Control_4 correspond to different combinations of a scan enable control signal, a channel masking control signal, a MISR reset control signal, a MISR read control signal, and an override functional reset control signal.

With the arrangement of FIG. 4B, scan control signals and scan data are provided by the available input pins (GPIO_0 and GPIO_1), which correspond to scan input pins and/or shared scan input/output pins (e.g., pins 116 of the interface 114) as described herein. In some examples, CTRL or TMS is provided by an internal controller for an IC or related scan test decoder. In these examples, CTRL or TMS is received via an IC interface (e.g., the interface 114 of FIG. 1). In one example, even though TMS is usually static low during a scan test, TMS may be used as CTRL. Also, in the example of FIG. 4B, GPIO_0 and GPIO_1 are coupled to respective scan input pins or shared scan input/output pins. Also, SCANIN_0 and SCANIN_1 are coupled to a CoDec (e.g., the decompressor 214 of FIG. 2) as a pseudo scan input/output.

Figure 5:
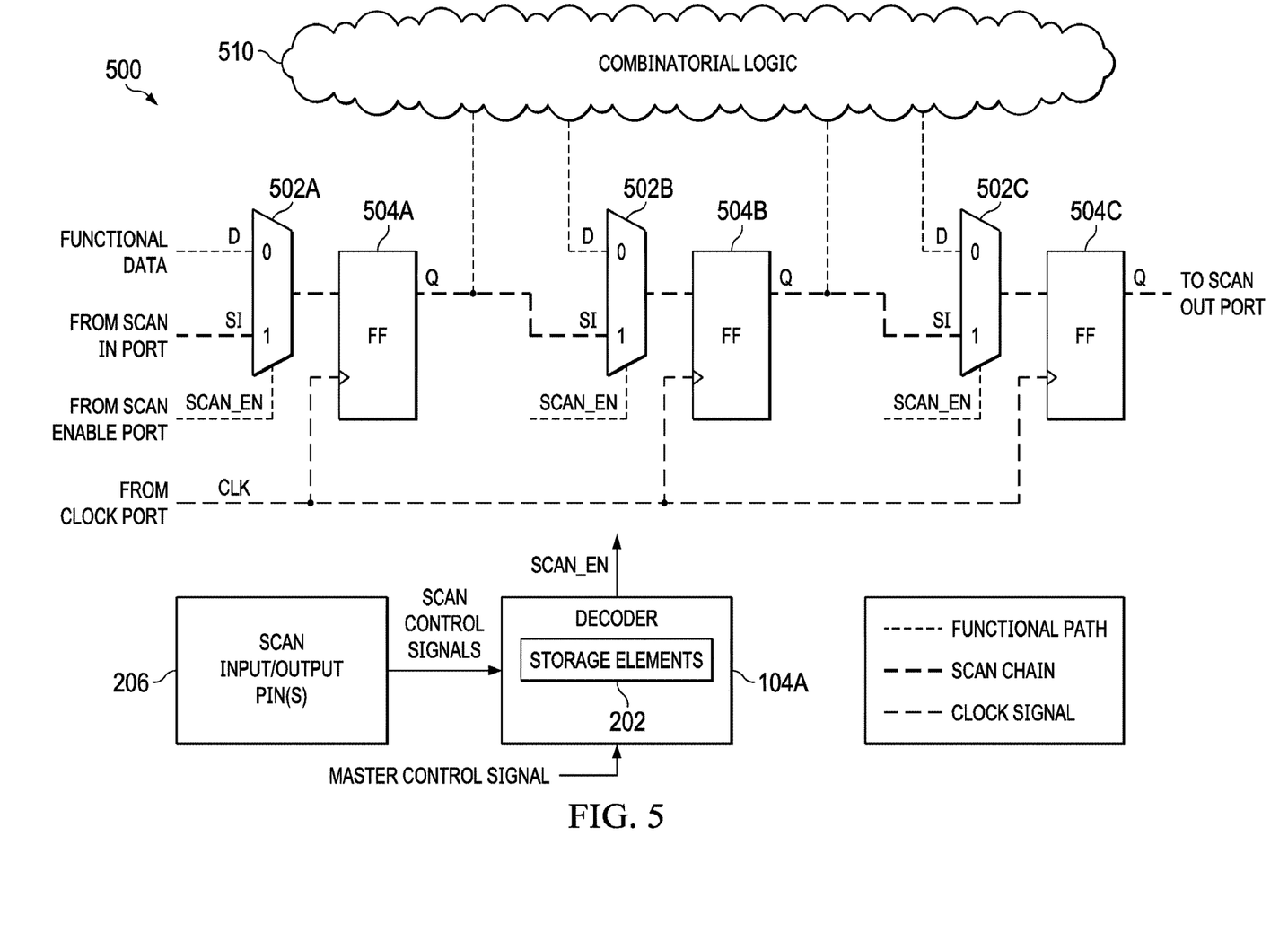
FIG. 5 is a schematic diagram showing a scan chain path scenario in accordance with some examples.

FIG. 5 is a schematic diagram showing a scan chain path scenario 500 (e.g., one of the scan chain paths 218A-218N) in accordance with some examples. In the scan chain path scenario 500, a SCAN_EN signal is used to selectively test combinatorial logic 510 or to pass test results to a scan output port. As shown, the combinatorial logic 510 is coupled to a series of flip-flops, including the flip-flops 504A-504C. Also, the flip-flops 504A-504C are coupled to respective multiplexers 502A-502C. As represented in FIG. 5, the multiplexer 502A is configured to pass functional data (D) or scan in port data (SI) to the flip-flop 504A based on the SCAN_EN signal. Also, the multiplexer 502B is configured to pass functional data (D) or scan in port data (SI) to the flip-flop 504B based on the SCAN_EN signal. Also, the multiplexer 502C is configured to pass functional data (D) or scan in port data (SI) to the flip-flop 504C based on the SCAN_EN signal. In some examples, the SCAN_EN signal is provided by the decoder 104A.

In the scan chain path scenario 500 of FIG. 5, the decoder 104A with storage elements 202 is again represented, where the decoder 104A is configured to provide different scan control signals (e.g., SCAN_EN, CMLE, MRE, MISRO, etc.) based on scan control signals received from at least one scan pin 206 (e.g., scan input pins and/or shared scan input/output pins). In some examples, the scan control signals are loaded to the storage elements 202. When the master control signal is received by the decoder 104A, the programed SCAN_EN is released to the multiplexers 502A-502C represented in the scenario 500. In different scenarios, the decoder 104A may additionally or alternatively release other scan control signals, besides SCAN_EN, as described herein.

In some examples, various operations are performed using the scan chain path scenario 500. In one example, a scan chain configuration is set up (activating scan shift) by asserting scan enable to its active logic level. Next, values are shifted into the active scan chains. Afterword, the scan load ends, optional stimulus is applied to the primary inputs, and the primary outputs are measured. Next, clocks are pulsed to capture the test circuit responses. Next, the scan chain configuration is set up again by asserting scan enable to its active logic level. Then, values are shifted out of the active scan chains, and the scan pattern completes.

Figure 6:
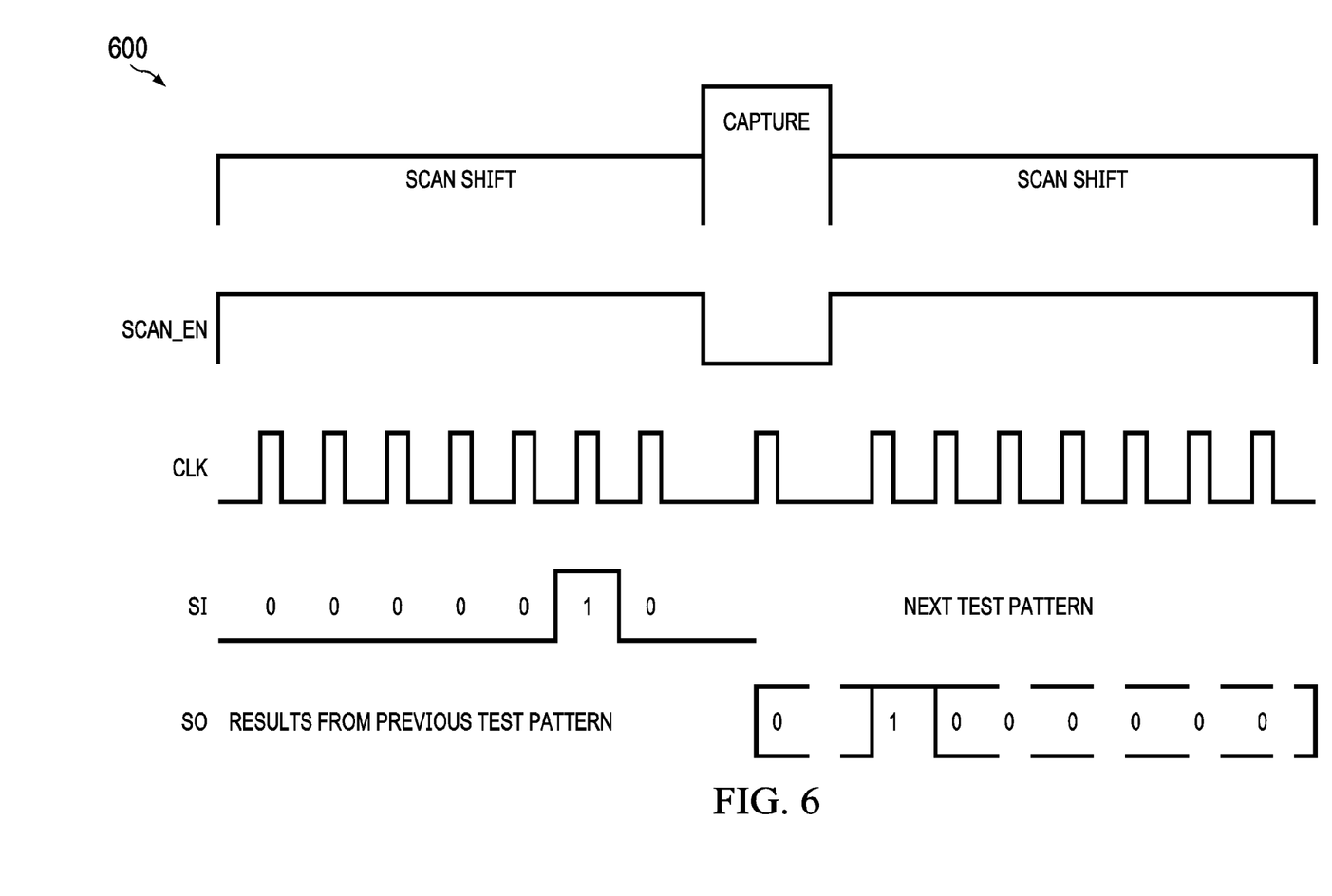
FIG. 6 is a timing diagram showing waveforms related to the scan chain path scenario of FIG. 5 in accordance with some examples.

FIG. 6 is a timing diagram 600 showing waveforms related to the scan chain of FIG. 5 in accordance with some examples. In the timing diagram 600, various waveforms are represented including a SCAN_EN signal, a clock signal (CLK), a scan input signal (SI), and a scan output signal (SO). As shown, when the SCAN_EN signal is high, scan shift operations are performed to shift in a test pattern (represented by SI) into flip-flops of a scan chain path (e.g., the flip-flops 504A-504C of FIG. 5). After a first set of scan shift operations are complete, the SCAN_EN signal goes low and capture operations are performed. After the capture operations are complete, the SCAN_EN signal goes high again, and response is shifted out through scan output (SO) signal while a next test pattern (represented by SI) is shifted to the flip-flops of a scan chain path (e.g., the flip-flops 504A-504C of FIG. 5).

With the disclosed scan test control decoder options, various advantages are achieved. For example, no counters and no pattern detection mechanism is used, which simplifies the implementation compared to other scan test control decoder options. Also, the disclosed scan test decoder options are suitable for any scan chain lengths as well as any type of scan compression proving its scalability. Also, there is negligible area overhead for the solution proposed (a few registers and/or latches). Also, the proposed scan control decoder options are not limited to support scan operations only. Other example uses include functional operations where time consuming firmware download can be highly accelerated. Also, the disclosed decoder options are able to generate scan control signals in only a few cycle events.

Hence, there is no overhead of extra cycles, which is an improvement over other options for generating scan control signals. Also, significant test time savings is achievable with the proposed implementation by releasing any dedicated scan control signal for scan data purposes. In some examples, the disclosed decoder options are suitable for low pin count designs (e.g., 4 or 2 data pins only). Also, with the disclosed decoder options, the scan data bandwidth can be increased by manifolds. Also, the multisite factor is increased compared to other options (e.g., due to higher pin requirement). Also, with the disclosed decoder options, sequences for shifting scan control signals into the storage elements can be embedded during pattern generation. Hence, no test vector modifications are required for the disclosed decoder options, unlike some other solutions. The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An integrated circuit (IC), comprising:
   logic components;
   a scan test circuit coupled to the logic components, the scan test circuit including multiple latches;
   a scan input/output pin coupled to the scan test circuit;
   wherein the scan test circuit is configured to:
   store different scan control signals in the multiple latches, respectively in response to an input control signal; and
   output at least one of the different scan control signals in response to a master control signal.

2. The IC of claim 1, wherein the scan test circuit further includes multiple flip-flops associated with the multiple latches, respectively, to form multiple latch and flip-flop sets, each of which is configured to shift in a respective one of the different scan control signals.

3. The IC of claim 2, wherein a first of the different scan control signals is a scan enable control signal, a first of the multiple latch and flip-flop sets being configured to shift in the scan enable control signal.

4. The IC of claim 2, wherein a second of the different scan control signals is a channel masking control signal, a second of the multiple latch-flip-flop sets being configured to shift in the masking control signal.

5. The IC of claim 2, wherein a second of the different scan control signals is one of a multiple input shift register (MISR) reset control signal, a MISR read control signal, or an override functional reset control signal, a second latch and flip-flop set of the multiple latch and flip-flop sets being configured to shift in the second scan control signal.

6. The IC of claim 1, wherein the scan input/output pin is shared dynamically between at least two of scan input data, scan output data, and scan control signals.

7. The IC of claim 1, wherein the scan test circuit further includes multiple flip-flops coupled to the multiple latches, respectively.

8. The IC of claim 7, wherein each of the multiple flip-flops has an output coupled to an input of a respective one of the multiple latches.

9. The IC of claim 8, wherein each of the multiple latches has an output, one of which is configured to output the at least one of the different scan control signals in response to the master control signal.

10. The IC of claim 9, wherein a respective one of the outputs of the multiple latches is configured to output a respective one of the different scan control signals.

11. The IC of claim 1, wherein the different scan control signals include a multiple input shift register (MISR) reset control signal or MISR read control signal.

12. The IC of claim 1, wherein the scan test circuit is configured to operate without counters.

13. The IC of claim 1, wherein the scan test circuit further includes a decoder coupled to the multiple latches.

* * * * *